(12) United States Patent
Aoi

(10) Patent No.: US 6,710,451 B2
(45) Date of Patent: Mar. 23, 2004

(54) INTERCONNECT STRUCTURE AND METHOD FOR FORMING THE SAME

(75) Inventor: Nobuo Aoi, Nishinomiya (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/845,325

(22) Filed: May 1, 2001

(65) Prior Publication Data

US 2001/0026019 A1 Oct. 4, 2001

Related U.S. Application Data

(62) Division of application No. 09/256,211, filed on Feb. 24, 1999, now Pat. No. 6,242,339.

(30) Foreign Application Priority Data

Feb. 26, 1998 (JP) ............................................. 10-044814

(51) Int. Cl.[7] ............................................. H01L 23/48
(52) U.S. Cl. ...................................... 257/759; 257/774
(58) Field of Search ................................. 257/758, 759, 257/774; 438/598, 599, 618, 622, 624, 626

(56) References Cited

U.S. PATENT DOCUMENTS

| | | | |
|---|---|---|---|
| 5,030,699 A | | 7/1991 | Motoyama et al. |
| 5,643,838 A | | 7/1997 | Dean et al. |
| 5,795,823 A | | 8/1998 | Avanzino et al. |
| 5,837,614 A | * | 11/1998 | Yamazaki et al. ........... 438/789 |
| 5,976,972 A | | 11/1999 | Inohara et al. |
| 5,989,998 A | * | 11/1999 | Sugahara et al. ........... 438/623 |
| 6,054,379 A | | 4/2000 | Yau et al. |
| 6,087,250 A | * | 7/2000 | Hyakutake ................. 438/598 |
| 6,294,833 B1 | * | 9/2001 | Usami ........................ 257/758 |

FOREIGN PATENT DOCUMENTS

| | | | | |
|---|---|---|---|---|
| JP | 1-160020 | * | 6/1989 | ......... H01L/21/302 |
| JP | 2-156538 | * | 6/1990 | ......... H01L/21/302 |

OTHER PUBLICATIONS

S. McClatchie, et al. "Low dielectric constant flowfill technology for IMD applications", DUMIC Conf. pp. 34–40, Feb. 1997.

G. Sugahara et al., "Low dielectric constant carbon containing SiO2 films deposited by PECVD technique using a novel CVD precursor", DUMIC Conf. pp. 19–25, Feb. 1997.

S. Nguyen et al., "Reaction Mechanisms Of Plasma–and Thermal–Assisted Chemical Vapor Deposition Of Tetraethylorthosilicate Oxide Films", J.Electrochem. Soc., vol. 137, No. 7, Jul. 1990.

Peter Van Zant, "Microchip Fabrication: A Practical Guide To Semiconductor Processing", Fourth Edition.

Jin Yong Kim et al., "Origin Of Low Dielectric Constant Of Carbon–Incorporated Silicon Oxide Film Deposited By Plasma Enhanced Chemical Vapor Deposition", J. Appl. Phys., vol. 90, No. 5, Sep. 1, 2001.

* cited by examiner

*Primary Examiner*—Ori Nadau
(74) *Attorney, Agent, or Firm*—Nixon Peabody LLP; Donald R. Studebaker

(57) ABSTRACT

An interconnection structure includes an interlevel insulating film, made of organic-containing silicon dioxide, between lower- and upper-level metal interconnects. A phenyl group, bonded to a silicon atom, is introduced into silicon dioxide in the organic-containing silicon dioxide.

9 Claims, 13 Drawing Sheets

INTERCONNECT STRUCTURE AND METHOD FOR FORMING THE SAME

This application is a division of application Ser. No. 09/256,211, filed Feb. 24, 1999, now U.S. Pat. No. 6,242,339.

BACKGROUND OF THE INVENTION

The present invention relates to interconnection structure and method for forming the same in a semiconductor integrated circuit.

As the number of devices, integrated within a single semiconductor integrated circuit, has been tremendously increasing these days, wiring delay has also increasing noticeably. This is because the larger the number of devices integrated, the larger line-to-line capacitance (i.e., parasitic capacitance between metal interconnects), thus interfering with the performance improvement of a semiconductor integrated circuit. The wiring delay is so-called "RC delay", which is proportional to the product of the resistance of metal interconnection and the line-to-line capacitance.

In other words, to reduce the wiring delay, either the resistance of metal interconnection or the line-to-line capacitance should be reduced.

In order to reduce the interconnection resistance, IBM Corp., Motorola, Inc., etc. have reported semiconductor integrated circuits using copper, not aluminum alloy, as a material for metal interconnects. A copper material has a specific resistance about two-thirds as high as that of an aluminum alloy material. Accordingly, in accordance with simple calculation, the wiring delay involved with the use of a copper material for metal interconnects can be about two-thirds of that involved with the use of an aluminum alloy material therefor. That is to say, the operating speed can be increased by about 1.5 times.

However, the number of devices, integrated within a single semiconductor integrated circuit, will certainly continue to increase by leaps and bounds from now on, thus further increasing the wiring delay considerably. Therefore, it is concerned that even the use of copper as an alternate metal interconnection material would not be able to catch up with such drastic increase. Also, the specific resistance of copper as a metal interconnection material is just a little bit higher than, but almost equal to, that of gold or silver. Accordingly, even if gold or silver is used instead of copper as a metal interconnection material, the wiring delay can be reduced only slightly.

Under these circumstances, not only reducing interconnection resistance but also suppressing line-to-line capacitance play a key role in further increasing the number of devices that can be integrated within a single semiconductor integrated circuit. And the relative dielectric constant of an interlevel insulating film should be reduced to suppress the line-to-line capacitance. A silicon dioxide film has heretofore been used as a typical material for an interlevel insulating film. The relative dielectric constant of a silicon dioxide film is, however, about 4 to about 4.5. Thus, it would be difficult to apply a silicon dioxide film to a semiconductor integrated circuit incorporating an even larger number of devices.

In order to solve such a problem, fluorine-doped silicon dioxide film, low-dielectric-constant spin-on-glass (SOG) film, organic polymer film and so on have been proposed as alternate interlevel insulating films with respective relative dielectric constants smaller than that of a silicon dioxide film.

The relative dielectric constant of a fluorine-doped silicon dioxide film is about 3.3 to about 3.7, which is about 20 percent lower than that of a conventional silicon dioxide film. Nevertheless, a fluorine-doped silicon dioxide film is highly hygroscopic, and easily absorbs water in the air, resulting in various problems in practice. For example, when the fluorine-doped silicon dioxide film absorbs water, SiOH groups, having a high relative dielectric constant, are introduced into the film. As a result, the relative dielectric constant of the fluorine-doped silicon dioxide film adversely increases, or the SiOH groups react with the water during a heat treatment to release $H_2O$ gas. In addition, fluorine free radicals, contained in the fluorine-doped silicon dioxide film, segregate near the surface thereof during a heat treatment and react with Ti, contained in a TiN layer formed thereon as an adhesion layer, to form a TiF film, which easily peels off.

An HSQ (hydrogen silsesquioxane) film, composed of Si, O and H atoms, is an exemplary low-dielectric-constant SOG film. In the HSQ film, the number of the H atoms is about two-thirds of that of the O atoms. However, the HSQ film releases a larger amount of water than a conventional silicon to dioxide film. Accordingly, since it is difficult to form buried interconnection in the HSQ film, a patterned metal film should be formed as metal interconnects on the HSQ film.

Also, since the HSQ film cannot adhere strongly to metal interconnects, a CVD oxide film should be formed between the metal interconnects and the HSO film to improve the adhesion therebetween. However, in such a case, if the CVD oxide film is formed on the metal interconnects, then the substantial line-to-line capacitance is equal to the serial capacitance formed by the HSQ and CVD films. This is because the CVD oxide film with a high dielectric constant exists between the metal interconnects. Accordingly, the resulting line-to-line capacitance is larger as compared with using the HSQ film alone.

An organic polymer film, as well as the low-dielectric constant SOG film, cannot adhere strongly to metal interconnects. Accordingly, a CVD oxide film should be formed as an adhesion layer between the metal interconnects and the organic polymer film, too.

Moreover, an etch rate, at which an organic polymer film is etched, is approximately equal to an ash rate, at which a resist pattern is ashed with oxygen plasma. Accordingly, a usual resist application process is not applicable in such a situation, because the organic polymer film is likely to be damaged during ashing and removing the resist pattern. Therefore, a proposed alternate process includes: forming a CVD oxide film on an organic polymer film; forming a resist film on the CVD oxide film; and then etching the resist film using the CVD oxide film as an etch stopper, or a protective film.

However, during the step of forming the CVD oxide film on the organic polymer film, the surface of the organic polymer film is exposed to a reactive gas containing oxygen. Accordingly, the organic polymer film reacts with oxygen to take in polar groups such as carbonyl groups and ketone groups. As a result, the relative dielectric constant of the organic polymer film disadvantageously increases.

Also, in forming inlaid copper interconnects in the organic polymer film, a TiN adhesion layer, for example, should be formed around wiring grooves formed in the organic polymer film, because the organic polymer film cannot adhere strongly to the metal interconnects. However, since the TiN film has a high resistance, the effective cross-sectional area of the metal interconnects decreases. Consequently, the intended effect attainable by the use of the copper lines, i.e., reduction in resistance, would be lost.

SUMMARY OF THE INVENTION

An object of the present invention is providing an interconnection structure, in which an interlevel insulating film with a low dielectric constant can be formed to adhere strongly to organic film, oxide film or metal film, and a method for forming the same.

A first interconnection structure according to the present invention includes an interlevel insulating film, made of organic-containing silicon dioxide, between lower- and upper-level metal interconnects. In the organic-containing silicon dioxide, a phenyl group, bonded to a silicon atom, is introduced into silicon dioxide.

In the first interconnection structure, a phenyl group, bonded to a silicon atom, is introduced into silicon dioxide in the organic-containing silicon dioxide as a material for the interlevel insulating film. Accordingly, such a film can be processed as well as a conventional CVD oxide film, has a relative dielectric constant as low as that of an HSQ film, and can adhere strongly to organic film, oxide film or metal film. Thus, the number of devices that can be integrated within a single semiconductor integrated circuit can be easily increased without modifying the conventional semiconductor device manufacturing process. As a result, a high-performance semiconductor integrated circuit, operative at a high speed and with lower power dissipation, is realized.

A second interconnection structure according to the present invention includes: lower-level metal interconnects; a first insulating film formed over the lower-level metal interconnects and mainly composed of organic-containing silicon dioxide, in which silicon dioxide contains an organic component; a second insulating film formed over the first insulating film and mainly composed of an organic component; upper-level metal interconnects formed in the second insulating film; and contacts formed in the first insulating film to interconnect the lower- and upper-level metal interconnects.

In the second interconnection structure, a first insulating film, mainly composed of organic-containing silicon dioxide, is formed under a second insulating film mainly composed of an organic component. Thus, in forming wiring grooves by etching the second insulating film using a resist pattern as a mask, the first insulating film, mainly composed of organic-containing silicon dioxide and having a low relative dielectric constant, functions as an etch stopper. That is to say, since a CVD oxide film with a high dielectric constant need not be formed as an etch stopper under the second insulating film, the relative dielectric constant of this interlevel insulating film can be lower than that of a conventional interlevel insulating film.

In one embodiment of the present invention, a phenyl group, bonded to a silicon atom, is preferably introduced into silicon dioxide in the organic-containing silicon dioxide.

In such an embodiment, the relative dielectric constant of the first insulating film can be further reduced and the adhesion between the first insulating film and the lower-level metal interconnects can be improved.

A third interconnection structure according to the present invention includes: metal interconnects; a first insulating film, which is formed over the metal interconnects to cover the metal interconnects and to leave grooves between the metal interconnects and is mainly composed of organic-containing silicon dioxide, in which silicon dioxide contains an organic component; a second insulating film, which is formed on the first insulating film to fill in the grooves and has a relative dielectric constant lower than that of the first insulating film; and a third insulating film, which is formed over the second insulating film and has a composition different from that of the second insulating film.

In the third interconnection structure, a first insulating film, mainly composed of organic-containing silicon dioxide adhering strongly to metal interconnects, is interposed between the metal interconnects and a second insulating film. Accordingly, there is no need to interpose a high-dielectric-constant adhesion layer between the metal interconnects and a second insulating film. Also, the first insulating film is formed over the metal interconnects to leave grooves therebetween and the second insulating film, having a relative dielectric constant lower than that of the first insulating film, is formed to fill in the grooves. That is to say, the second insulating film with a lower relative dielectric constant is interposed between the metal interconnects. As a result, the relative dielectric constant of the interlevel insulating film can be greatly lower than that of a conventional one.

In one embodiment of the present invention, the second insulating film is preferably mainly composed of an organic component, and the third insulating film is preferably mainly composed of organic-containing silicon dioxide, in which silicon dioxide contains an organic component.

In another embodiment of the present invention, a phenyl group, bonded to a silicon atom, is preferably introduced into silicon dioxide in the organic-containing silicon dioxide.

A first method for forming an interconnection structure according to the present invention includes the steps of: forming an interlevel insulating film out of organic-containing silicon dioxide over lower-level metal interconnects by a CVD process using a reactive gas containing phenyltrimethoxy silane, a phenyl group, bonded to a silicon atom, being introduced into silicon dioxide in the organic-containing silicon dioxide; forming wiring grooves and contact holes, communicating with the wiring grooves and exposing the lower-level metal interconnects, in the interlevel insulating film; and forming upper-level metal interconnects and contacts, interconnecting the lower- and upper-level metal interconnects together, by filling in the wiring grooves and the contact holes with a metal film.

In the first method for forming an interconnection structure, an organic-containing silicon dioxide film is formed by a CVD process using a reactive gas containing phenyltrimethoxy silane. Thus, an organic-containing silicon dioxide film, in which a phenyl group, bonded to a silicon atom, is introduced into silicon dioxide, can be formed with certainty. Accordingly, an interlevel insulating film, which can be processed as well as a conventional CVD oxide film, has a relative dielectric constant as low as that of an HSQ film, and can adhere strongly to organic film, oxide film or metal film, can be formed between the lower- and upper-level metal interconnects with certainty.

A second method for forming an interconnection structure according to the present invention includes the steps of: forming a first insulating film, mainly composed of organic-containing silicon dioxide, in which silicon dioxide contains an organic component, over lower-level metal interconnects; forming a second insulating film, mainly composed of an organic component, over the first insulating film; forming wiring grooves and contact holes, which communicate with the wiring grooves and expose the lower-level metal interconnects, by selectively etching the second and first insulating films, respectively; and forming upper-level metal interconnects and contacts, interconnecting the lower- and upper-level metal interconnects together, by filling in the wiring grooves and the contact holes with a metal film.

In the second method for forming an interconnection structure, a first insulating film, mainly composed of organic-containing silicon dioxide, in which silicon dioxide contains an organic component, is formed over lower-level metal interconnects, and then a second insulating film, mainly composed of an organic component, is formed over the first insulating film. Thus, in the step of forming wiring grooves by selectively etching the second insulating film, the first insulating film functions as an etch stopper. That is to say, since a CVD oxide film with a high dielectric constant need not be formed as an etch stopper under the second insulating film, the relative dielectric constant of this interlevel insulating film can be lower than that of a conventional one.

In one embodiment of the present invention, a phenyl group, bonded to a silicon atom, is preferably introduced into silicon dioxide in the organic-containing silicon dioxide.

In such an embodiment, the relative dielectric constant of the first insulating film can be further reduced and the adhesion between the first insulating film and the lower-level metal interconnects can be improved.

A third method for forming an interconnection structure according to the present invention includes the steps of: forming a first insulating film, mainly composed of organic-containing silicon dioxide, in which silicon dioxide contains an organic component, over metal interconnects to cover the metal interconnects and to leave grooves between the metal interconnects; forming a second insulating film, having a relative dielectric constant lower than that of the first insulating film, on the first insulating film to fill in the grooves; and forming a third insulating film, having a composition different from that of the second insulating film, over the second insulating film.

In the third method for forming an interconnection structure, a first insulating film, mainly composed of organic-containing silicon dioxide, is formed over metal interconnects to leave grooves therebetween, and then a second insulating film, having a lower relative dielectric constant, is formed over the first insulating film to fill in the grooves. Accordingly, there is no need to interpose a high-dielectric-constant adhesion layer between the metal lines and the second insulating film. Instead, the second insulating film with a low relative dielectric constant is interposed between the metal interconnects. As a result, the relative dielectric constant of the interlevel insulating film can be greatly lower than that of a conventional one.

In one embodiment of the present invention, the second insulating film is preferably mainly composed of an organic component, and the third insulating film is preferably mainly composed of organic-containing silicon dioxide, in which silicon dioxide contains an organic component.

In such an embodiment, a third insulating film, mainly composed of organic-containing silicon dioxide, is formed over a second insulating film mainly composed of an organic component. Accordingly, in the step of ashing and removing a resist pattern with plasma, it is possible to prevent the second insulating film from being damaged by the plasma.

In this case, a phenyl group, bonded to a silicon atom, is preferably introduced into silicon dioxide in the organic-containing silicon dioxide.

In such an embodiment, the relative dielectric constant of the third insulating film can be further reduced and the adhesion between the third insulating film and metal interconnects to be formed on the third insulating film can be improved.

A fourth method for forming an interconnection structure according to the present invention includes the steps of: forming a first insulating film over lower-level metal interconnects; forming a second insulating film, which has a different composition than that of the first insulating film and is mainly composed of an organic component, over the first insulating film; forming a conductive film on the second insulating film; forming a first resist pattern, having a plurality of openings for forming wiring grooves, on the conductive film; etching the conductive film using the first resist pattern as a mask, thereby forming a mask pattern out of the conductive film to have the openings for forming wiring grooves; forming a second resist pattern, having a plurality of openings for forming contact holes, over the first resist pattern; selectively etching the second insulating film, thereby patterning the second insulating film to have the openings for forming contact holes and removing the first and second resist patterns; etching the first insulating film using the patterned second insulating film as a mask, thereby forming contact holes in the first insulating film to expose the lower-level metal interconnects; etching the second insulating film using the mask pattern as a mask, thereby forming wiring grooves in the second insulating film; and filling in the wiring grooves and the contact holes with a metal film, thereby forming upper-level metal interconnects and contacts interconnecting the lower- and upper-level metal interconnects together.

In the fourth method for forming an interconnection structure, the composition of the first insulating film, in which the contact holes are formed, is different from that of the second insulating film in which the wiring grooves are formed. Accordingly, in forming the wiring grooves by etching the second insulating film using a mask pattern as a mask, the first insulating film functions as an etch stopper. As a result, the depth of the wiring grooves can be self-aligned with the thickness of the second insulating film. Also, since the second insulating film is mainly composed of an organic component, the first and second resist patterns are removed during the step of forming the openings for forming contact holes in the second insulating film by selectively etching the second insulating film. That is to say, there is no need to perform the step of ashing and removing the first and second resist patterns. As a result, it is possible to prevent the second insulating film, mainly composed of an organic component, from being damaged during an ashing process step.

In one embodiment of the present invention, the first insulating film is preferably mainly composed of organic-containing silicon dioxide, in which silicon dioxide contains an organic component.

In such an embodiment, there is no need to interpose a high-dielectric-constant adhesion layer between the metal interconnects and the second insulating film. As a result, the relative dielectric constant of the interlevel insulating film can be greatly lower than that of a conventional one.

In this case, a phenyl group, bonded to a silicon atom, is preferably introduced into silicon dioxide in the organic-containing silicon dioxide.

In such an embodiment, the relative dielectric constant of the first insulating film can be further reduced and the adhesion between the metal interconnects and the first insulating film can be improved.

DESCRIPTION OF THE PREFERRED EMBODIMENTS

Embodiment 1

Hereinafter, interconnection structure and method for forming the same according to the first embodiment of the present invention will be described with reference to FIGS. 1(a) through 1(c), FIGS. 2(a) through 2(c) and FIGS. 3(a) through 3(c).

Figure 1A:
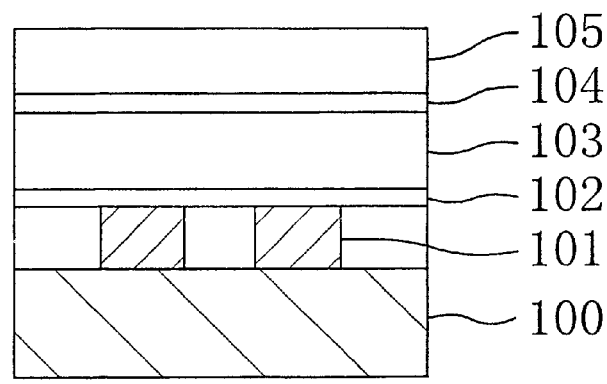
FIGS. 1(a) through 1(c) are cross-sectional views illustrating respective process steps for forming an interconnection structure according to the first embodiment of the present invention.

First, as shown in FIG. 1(a), a first silicon nitride film 102 is formed over first metal interconnects 101 formed on a semiconductor substrate 100. The first silicon nitride film 102 is formed to be 50 nm thick, for example, and to protect the first metal interconnects 101 during a subsequent etching process step. Thereafter, a first organic-containing silicon dioxide film 103, containing an organic component in silicon dioxide, is formed to be 1 μm thick, for example, on the first silicon nitride film 102. Next, a second silicon nitride film 104 is formed to be 50 nm thick, for example, on the first organic-containing silicon dioxide film 103 and to protect the first organic-containing silicon dioxide film 103 during a subsequent etching process step. Then, a second organic-containing silicon dioxide film 105, containing an organic component in silicon dioxide, is formed to be 400 nm thick, for example, on the second silicon nitride film 104. The first and second organic-containing silicon dioxide films 103 and 105 may be deposited by any arbitrary technique. For example, these films 103 and 105 may be deposited by a CVD process using a reactive gas mainly composed of phenyltrimethoxy silane. In such a case, first and second organic-containing silicon dioxide films 103 and 105, in which a phenyl group, bonded to a silicon atom, is introduced into silicon dioxide, can be obtained.

Figure 1B:
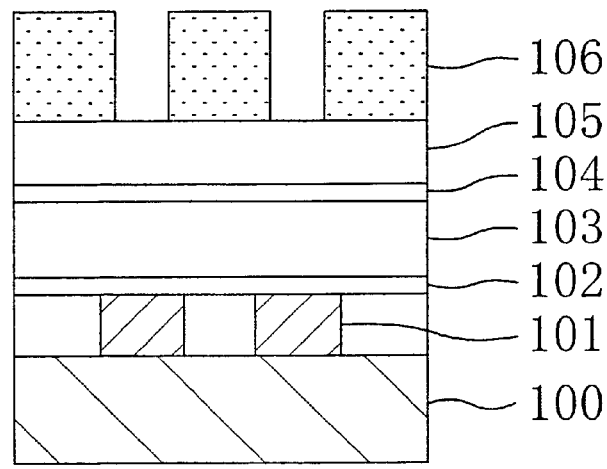
Figure 1C:
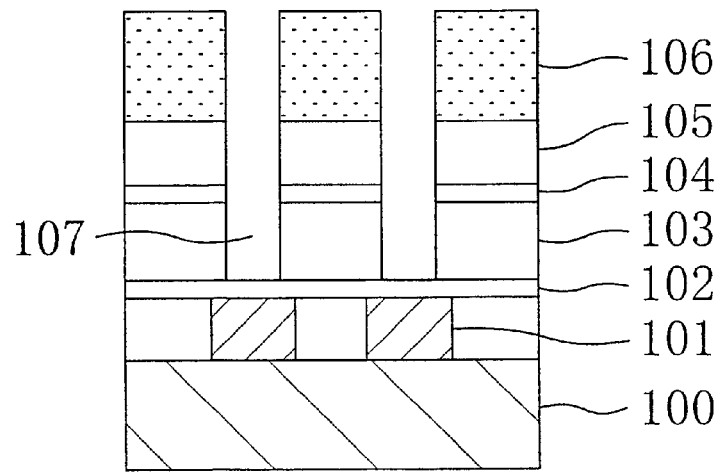

Next, as shown in FIG. 1(b), a first resist pattern 106, having openings for forming contact holes, is formed by lithography on the second organic-containing silicon dioxide film 105. Then, the first organic-containing silicon dioxide film 103, the second silicon nitride film 104 and the second organic-containing silicon dioxide film 105 are dry-etched using the first resist pattern 106 as a mask, thereby forming contact holes 107 in the first organic-containing silicon dioxide film 103 as shown in FIG. 1(c).

Figure 2A:
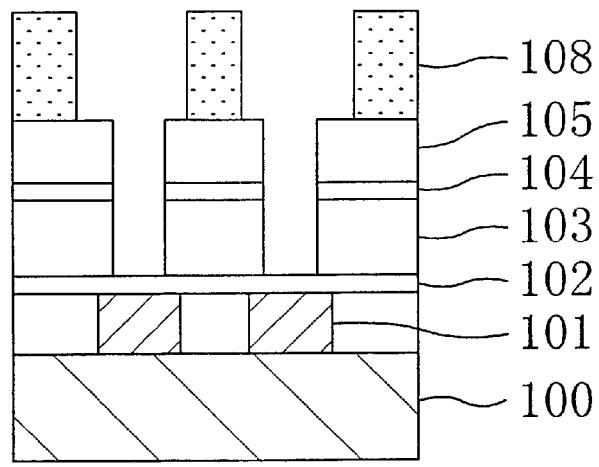
FIGS. 2(a) through 2(c) are cross-sectional views illustrating respective process steps for forming the interconnection structure of the first embodiment.
Figure 2B:
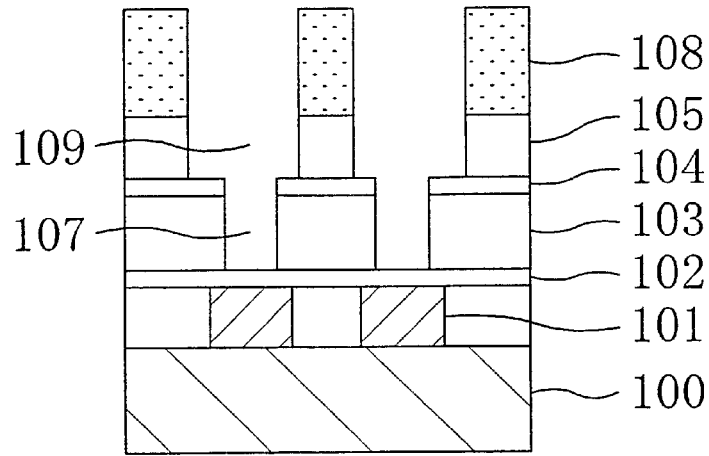

Subsequently, as shown in FIG. 2(a), a second resist pattern 108, having openings for forming wiring grooves, is formed by lithography on the second organic-containing silicon dioxide film 105. Then, the second organic-containing silicon dioxide film 105 is dry-etched using the second resist pattern 108 as a mask, thereby forming wiring grooves 109, communicating with the contact holes 107, in the second organic-containing silicon dioxide film 105 as shown in FIG. 2(b). In this dry-etching process step, etching is performed under such conditions that the second organic-containing silicon dioxide film 105 is etched at a rate higher than the rate at which the second silicon nitride film 104 is etched.

Figure 2C:
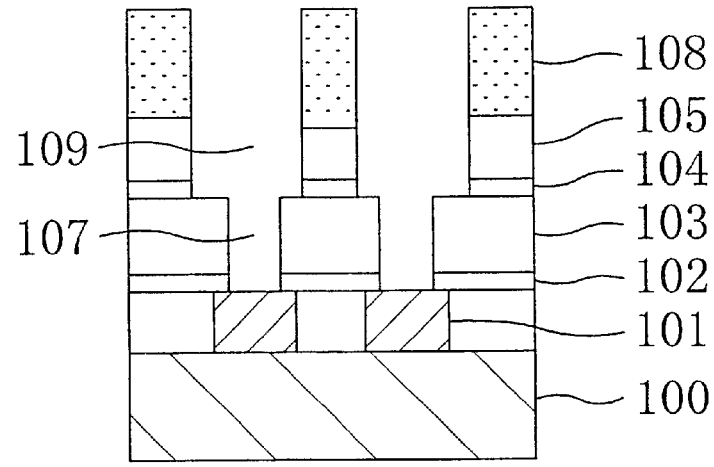

Subsequently, the first silicon nitride film 102 is dry-etched using the first organic-containing silicon dioxide film 103 as a mask, thereby exposing the first metal interconnects 101 within the contact holes 107 as shown in FIG. 2(c).

Figure 3A:
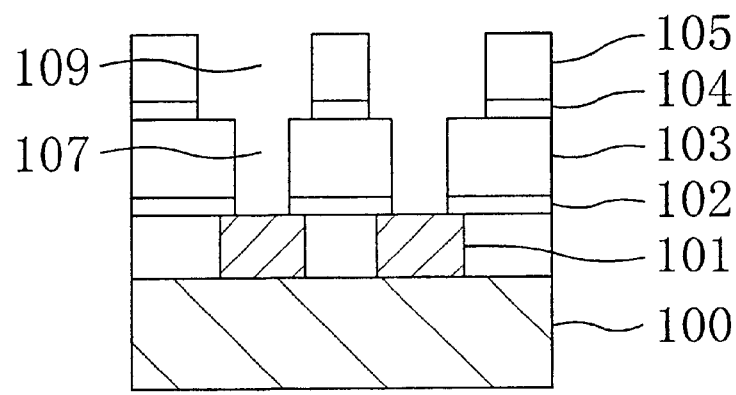
FIGS. 3(a) through 3(c) are cross-sectional views illustrating respective process steps for forming the interconnection structure of the first embodiment.
Figure 3B:
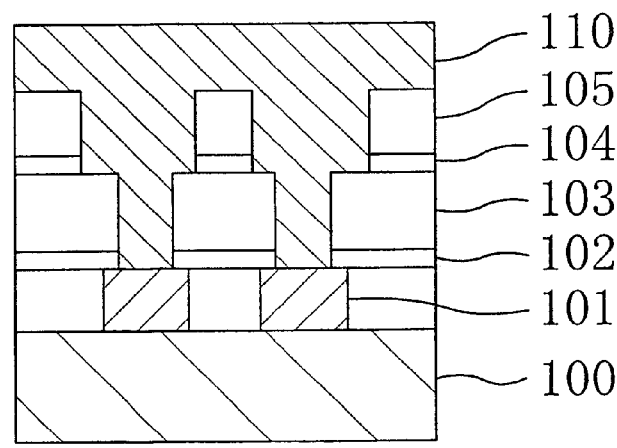

Then, as shown in FIG. 3(a), the second resist pattern 108 is removed. Subsequently, as shown in FIG. 3(b), a metal film 110 is deposited over the entire surface of the substrate to completely fill in the contact holes 107 and the wiring grooves 109. In this embodiment, the metal film 110 may be made of any arbitrary metal. For example, copper, aluminum, gold, silver, nickel, cobalt, tungsten, or an alloy thereof may be used. Also, the metal film 110 may be deposited by any arbitrary technique. For instance, plating, CVD or sputtering may be employed.

Figure 3C:
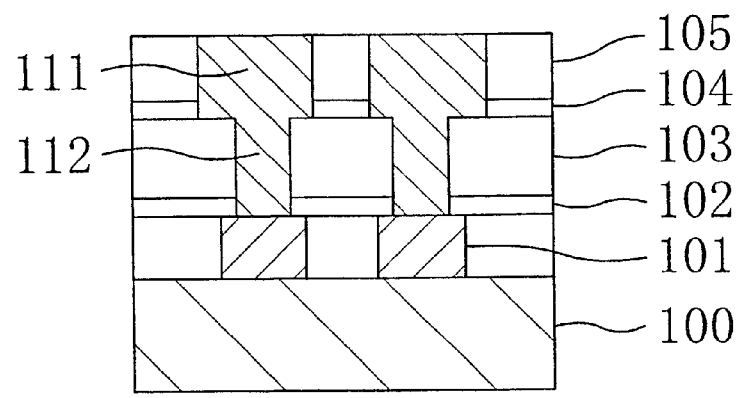

Finally, as shown in FIG. 3(c), portions of the metal film 110, which are deposited on the second organic-containing silicon dioxide film 105, are removed by a CMP technique, for example. As a result, second metal interconnects 111 and contacts 112, interconnecting the first and second metal interconnects 101 and 111, are formed out of the metal film 110.

In this embodiment, after the contact holes 107 have been formed, the wiring grooves 109 are formed. Alternatively, the contact holes 107 and the wiring grooves 109 may be formed in the reversed order.

It should be noted that a multilevel interconnection structure may be formed by forming respective films, interconnects and contacts on the second metal interconnects 111 through the same process steps as those described above.

In the first embodiment, the first and second organic-containing silicon dioxide films 103 and 105 are films formed by a CVD process using a reactive gas mainly composed of phenyltrimethoxy silane (hereinafter, such films will be referred to as "PTMS films"). Accordingly, in the PTMS films, a phenyl group (organic group), bonded to a silicon atom, has been introduced into silicon dioxide. Thus, a PTMS film shows a relative dielectric constant as low as 3.2 or less, heat resistance as high as 450° C. or more and very low hygroscopicity, and releases as small an amount of water as a conventional silicon dioxide film. That is to say, a PTMS film can be processed satisfactorily.

In addition, unlike a fluorine-doped CVD oxide film, a PTMS film does not contain fluorine free radicals. Thus, increase in relative dielectric constant due to high hygroscopicity, contact failure resulting from a high content of water and degradation or peeling at the interface with a metal film owing to locally high concentration of fluorine during heat treatment can be all avoided.

Moreover, adhesion of the PTMS film to a metal film is superior to that of a low-dielectric-constant SOG film or an organic polymer film to the metal film and approximately equal to that of a conventional CVD oxide film.

Furthermore, the PTMS film has both an organic group and a siloxane skeleton, and therefore can adhere strongly to organic film, oxide film or metal film. A conventional interlevel insulating film, like an organic polymer film or low-dielectric-constant SOG film, requires an adhesion layer formed around buried interconnects, a liner layer formed under metal interconnects made of a patterned metal film or a cover film formed on metal interconnects. In contrast, the PTMS film needs none of these. Accordingly, the PTMS film can be used as an interlevel insulating film by itself.

As described above, in the PTMS film, a phenyl group (organic group), bonded to a silicon atom, has been introduced into an oxide film. Thus, a PTMS film can be processed as well as a conventional CVD oxide film, shows a relative dielectric constant as low as that of an HSQ film and can adhere strongly to organic film, oxide film or metal film. Therefore, if a PTMS film is used as an interlevel insulating film for an interconnection structure in a semiconductor integrated circuit, the number of devices integrated can be easily increased by leaps and bounds without modifying the conventional semiconductor device manufacturing process. As a result, a semiconductor integrated circuit, operative at a high speed and with lower power dissipation, is realized.

Embodiment 2

Next, interconnection structure and method for forming the same according to the second embodiment of the present invention will be described with reference to FIGS. 4(a) through 4(c), FIGS. 5(a) through 5(c) and FIGS. 6(a) through 6(c).

Figure 4A:
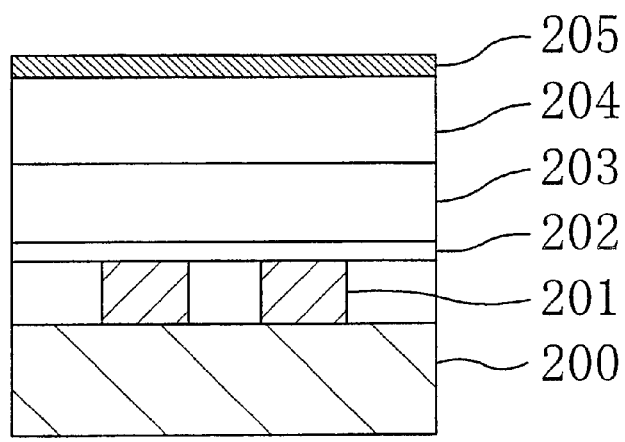
FIGS. 4(a) through 4(c) are cross-sectional views illustrating respective process steps for forming an interconnection structure according to the second embodiment of the present invention.

First, as shown in FIG. 4(a), a silicon nitride film 202 is formed over first metal interconnects 201 formed on a semiconductor substrate 200. The silicon nitride film 202 is formed to be 50 nm thick, for example, and to protect the first metal interconnects 201 during a subsequent etching process step. Thereafter, an organic-containing silicon dioxide film 203, containing an organic component in silicon dioxide, is formed to be 1 μm thick, for example, on the silicon nitride film 202. The organic-containing silicon dioxide film 203 may be deposited by any arbitrary technique. For example, the film 203 may be deposited by a CVD process using a reactive gas mainly composed of phenyltrimethoxy silane. In such a case, an organic-containing silicon dioxide film 203, in which a phenyl group, bonded to a silicon atom, is introduced into silicon dioxide, can be obtained.

Next, an organic film 204, mainly composed of an organic component, is deposited to be 400 nm thick, for example, on the organic-containing silicon dioxide film 203. The organic film 204 may be any arbitrary film. For example, the film 204 may be a hydrocarbon film or a fluorine-containing hydrocarbon film formed by plasma CVD, coating or thermal CVD. More specifically, the organic film 204 may be Teflon film, oxygen-containing Teflon film, polyimide fluoride film or polyaryl ether film. Thereafter, a titanium nitride film 205 is formed to be 50 nm thick, for example, on the organic film 204.

Figure 4B:
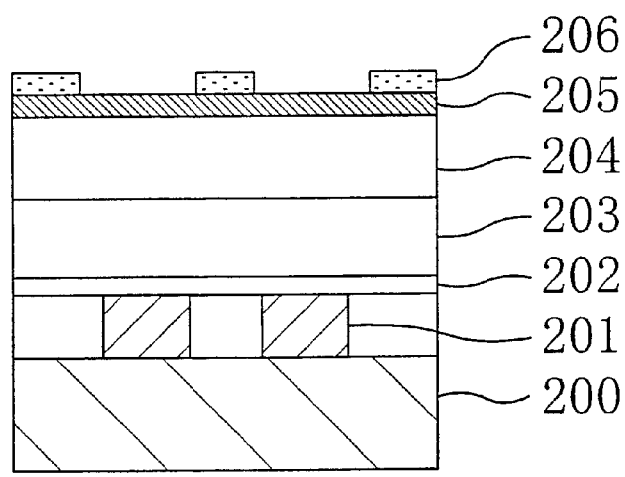
Figure 4C:
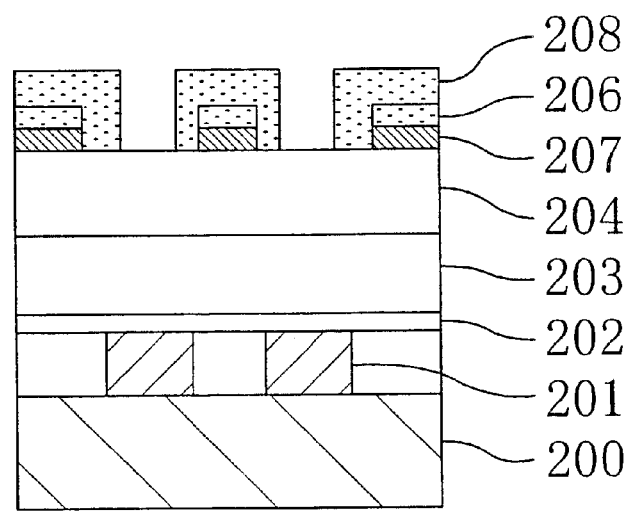

Next, as shown in FIG. 4(b), a first resist pattern 206, having openings for forming wiring grooves, is formed by lithography on the titanium nitride film 205. Then, the titanium nitride film 205 is dry-etched using the first resist pattern 206 as a mask, thereby forming a mask pattern 207 out of the titanium nitride film 205 as shown in FIG. 4(c).

Figure 5A:
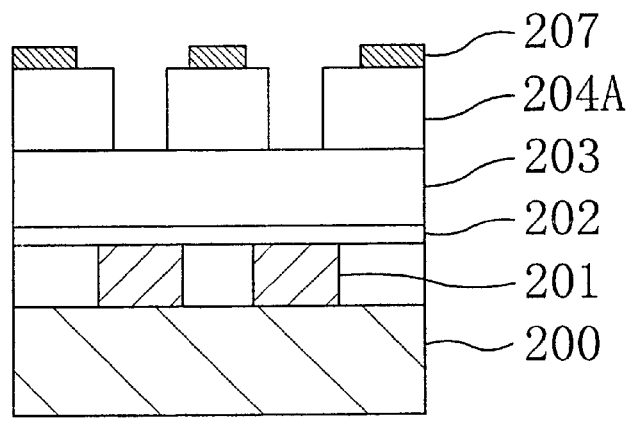
FIGS. 5(a) through 5(c) are cross-sectional views illustrating respective process steps for forming the interconnection structure of the second embodiment.

Subsequently, a second resist pattern 208, having openings for forming contact holes, is formed by lithography over the organic film 204 without removing the first resist pattern 206. Then, the organic film 204 is dry-etched, thereby forming a patterned organic film 204A having the openings for forming contact holes as shown in FIG. 5(a). In this case, since the organic film 204 and the first and second resist patterns 206 and 208 are all mainly composed of organic components, the etch rate of the organic film 204 is substantially equal to the etch rate of the first and second resist patterns 206 and 208. Accordingly, when the organic film 204 is dry-etched, the first and second resist patterns 206 and 208 are also removed simultaneously.

Figure 5B:
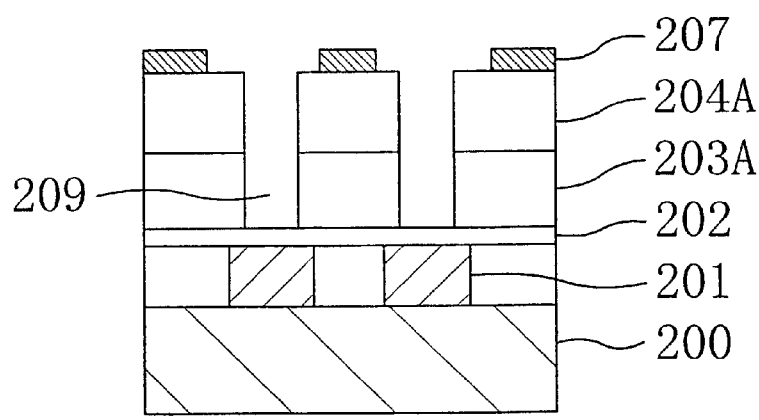

Then, the organic-containing silicon dioxide film 203 is dry-etched using the patterned organic film 204A as a mask, thereby forming a patterned organic-containing silicon dioxide film 203A having contact holes 209 as shown in FIG. 5(b). In this process step, by selecting such etching conditions that the etch rate of the organic-containing silicon dioxide film 203 is higher than that of the patterned organic film 204A, it is possible to prevent the patterned organic film 204A from being erroneously etched.

Figure 5C:
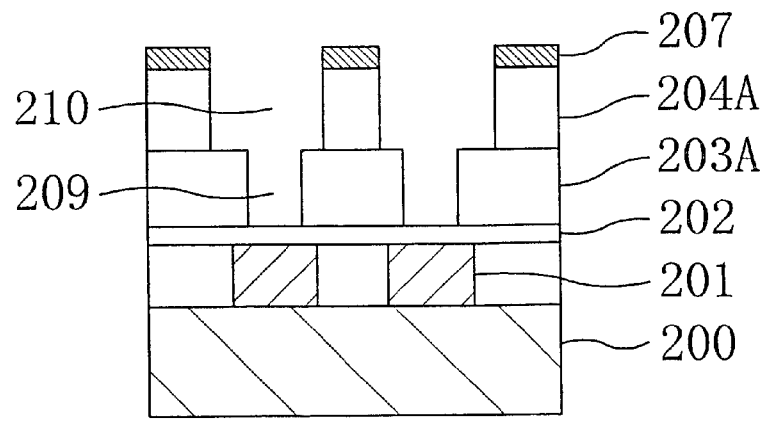

Next, the patterned organic film 204A is dry-etched using the mask pattern 207 as a mask, thereby forming wiring grooves 210 in the patterned organic film 204A as shown in FIG. 5(c).

Figure 6A:
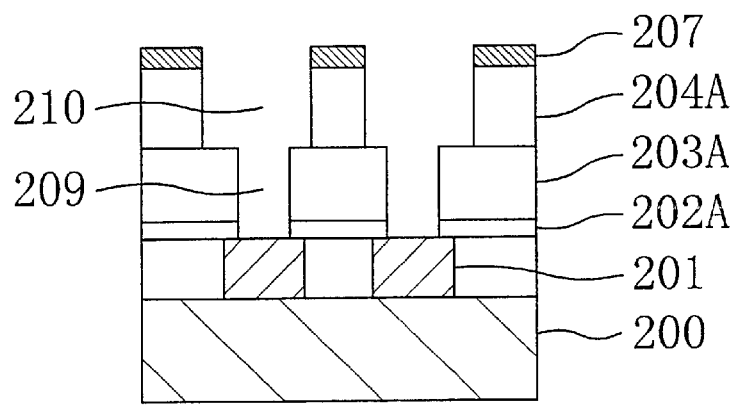
FIGS. 6(a) through 6(c) are cross-sectional views illustrating respective process steps for forming the interconnection structure of the second embodiment.

Subsequently, the silicon nitride film 202 is dry-etched using the patterned organic-containing silicon dioxide film 203A as a mask, thereby forming a patterned silicon nitride film 202A and exposing the first metal interconnects 201 inside the contact holes 209 as shown in FIG. 6(a).

Figure 6B:
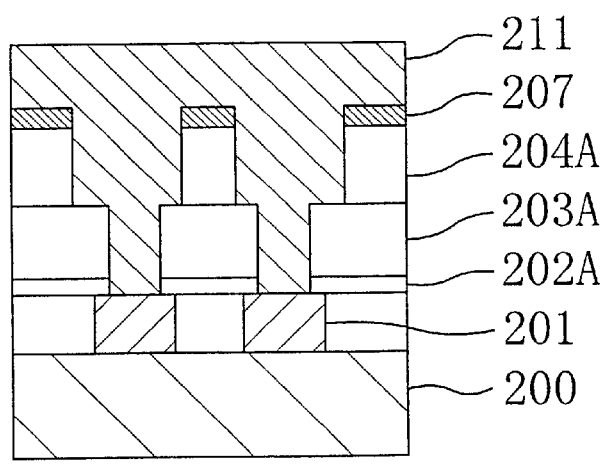

Then, as shown in FIG. 6(b), a metal film 211 is deposited over the entire surface of the substrate to completely fill in the contact holes 209 and the wiring grooves 210. In this embodiment, the metal film 211 may be made of any arbitrary metal. For example, copper, aluminum, gold, silver, nickel, cobalt, tungsten, or an alloy thereof may be used. Also, the metal film 211 may be deposited by any arbitrary technique. For instance, plating, CVD or sputtering may be employed.

Figure 6C:
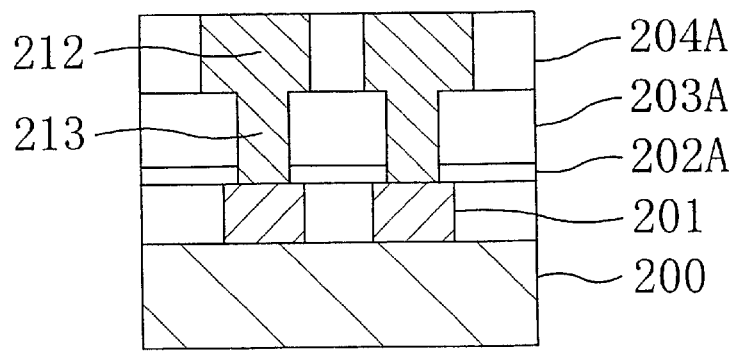

Finally, as shown in FIG. 6(c), respective portions of the metal film 211 and the mask pattern 207, which are deposited on the patterned organic film 204A, are removed by a CMP technique, for example. As a result, second metal interconnects 212 and contacts 213, interconnecting the first and second metal interconnects 201 and 212, are formed out of the metal film 211.

It should be noted that a multilevel interconnection structure may be formed by forming respective films, interconnects and contacts on the second metal interconnects 212 through the same process steps as those described above.

In the second embodiment, the organic-containing silicon dioxide film 203 is a PTMS film formed by a CVD process using a reactive gas mainly composed of phenyltrimethoxy silane as in the first embodiment. Accordingly, in the PTMS film, a phenyl group (organic group), bonded to a silicon atom, has been introduced into silicon dioxide. Thus, the PTMS film can be processed as well as a conventional CVD oxide film, shows a relative dielectric constant as low as that of an HSQ film and can adhere strongly to organic film, oxide film or metal film.

In addition, the first and second resist patterns 206 and 208 can be removed during the process step of dry-etching the organic film 204. Thus, it is no longer necessary to ash and remove the first and second resist patterns 206 and 208 with oxygen plasma. That is to say, it is possible to prevent the organic film 204 from being damaged during the step of ashing and removing a resist pattern. Accordingly, although the organic film 204 with a low relative dielectric constant is used as an interlevel insulating film, an ordinary resist application process is applicable to this embodiment.

Moreover, after the contact holes 209 have been formed in the organic-containing silicon dioxide film 203 by dry-etching the organic-containing silicon dioxide film 203 using the patterned organic film 204A as a mask, the wiring grooves 210 are formed in the patterned organic film 204A by dry-etching the patterned organic film 204A using the mask pattern to 207 as a mask. Accordingly, an insulating film, where the contact holes 209 are formed, may have a different composition than that of an insulating film, where the wiring grooves 210 are formed. In addition, since the contact holes 209 and the wiring grooves 210 are formed separately in distinct dry etching process steps, the depth of the wiring grooves 210 can match with the thickness of the organic film 204. That is to say, the depth of the wiring grooves 210 can be defined by self-alignment.

Hereinafter, problems caused by the misalignment of the second resist pattern 208 with the first resist pattern 206 and measured taken to solve the problems will be described.

First, it will be described with reference to FIGS. 7(a) through 7(c), FIGS. 8(a) through 8(c) and FIGS. 9(a) through 9(c) what problems are caused if the second resist pattern 208 has misaligned.

Figure 7A:
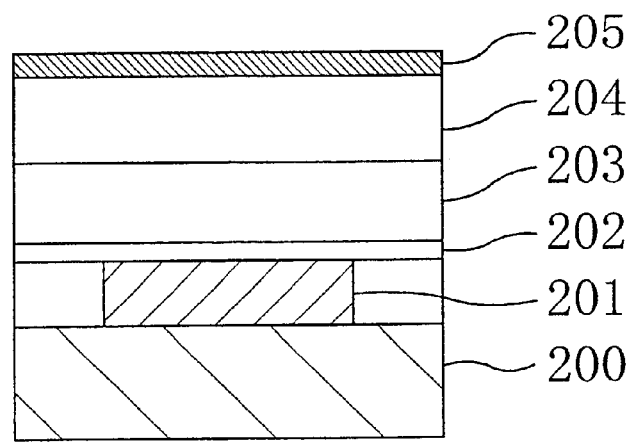
FIGS. 7(a) through 7(c) are cross-sectional views illustrating problems caused by the misalignment of the second resist pattern during the process of forming the interconnection structure of the second embodiment

As in the second embodiment, a silicon nitride film 202 is first formed to be 50 nm thick, for example, over first metal interconnects 201 formed on a semiconductor substrate 200 as shown in FIG. 7(a). Thereafter, an organic-containing silicon dioxide film 203, containing an organic component in silicon dioxide, is formed to be 1 μm thick, for example, on the silicon nitride film 202.

Next, an organic film 204, mainly composed of an organic component, is formed to be 400 nm thick, for example, on the organic-containing silicon dioxide film 203. Then, a titanium nitride film 205 is formed to be 50 nm thick, for example, on the organic film 204.

Figure 7B:
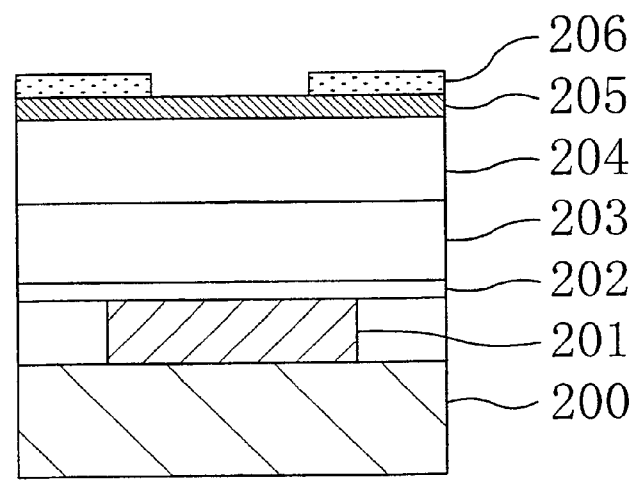
Figure 7C:
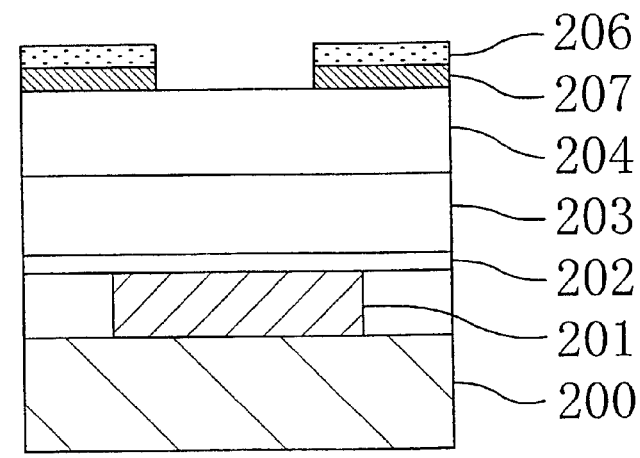

Then, as shown in FIG. 7(b), a first resist pattern 206, having openings for forming wiring grooves, is formed on the titanium nitride film 205. Thereafter, the titanium nitride film 205 is dry-etched using the first resist pattern 206 as a mask, thereby forming a mask pattern 207 out of the titanium nitride film 205 as shown in FIG. 7(c).

Figure 8A:
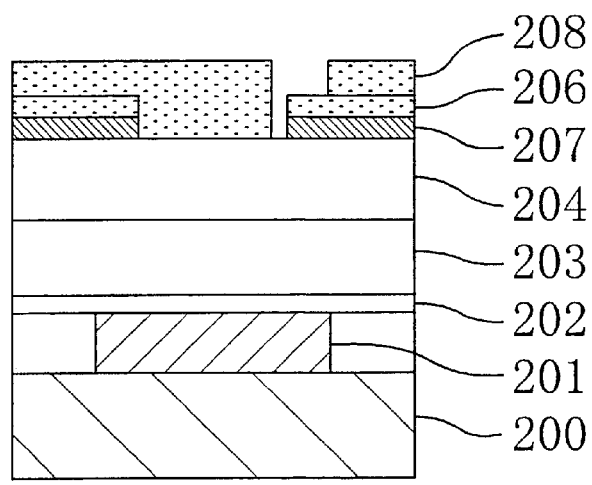
FIGS. 8(a) through 8(c) are cross-sectional views illustrating the problems caused by the misalignment of the second resist pattern during the process of forming the interconnection structure of the second embodiment.

Subsequently, a second resist pattern 208, having openings for forming contact holes, is formed over the organic film 204 without removing the first resist pattern 206. As can be seen if FIGS. 8(a) and 4(c) are compared with each other, the second resist pattern 208 has misaligned with the first resist pattern 206 in this case.

Figure 8B:
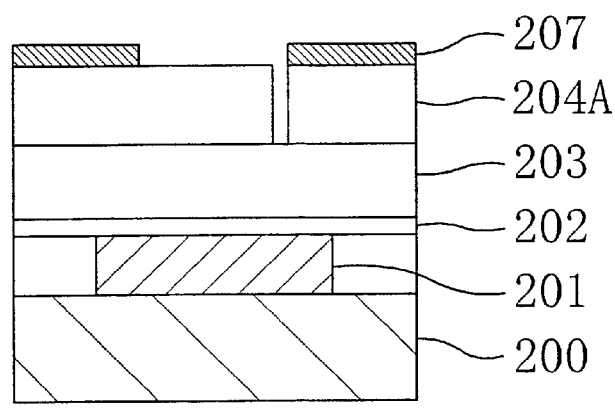

Then, the organic film 204 is dry-etched, thereby forming a patterned organic film 204A having the openings for forming contact holes as shown in FIG. 8(b). As in the second embodiment, since the organic film 204 and the first and second resist patterns 206 and 208 are all mainly composed of organic components, the first and second resist patterns 206 and 208 are removed simultaneously with the dry-etching of the organic film 204.

Figure 8C:
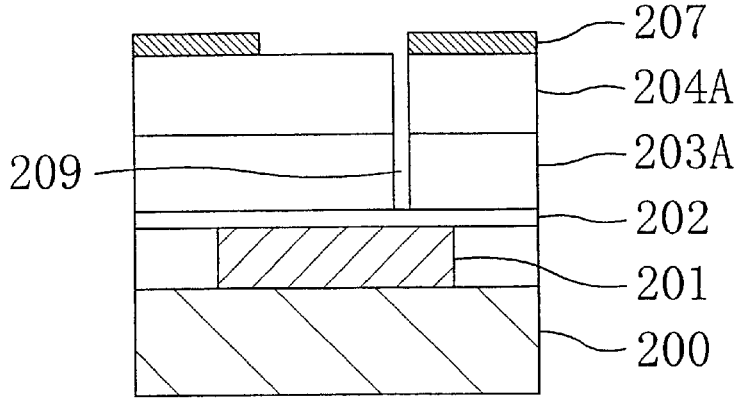

Then, the organic-containing silicon dioxide film 203 is dry-etched using the patterned organic film 204A as a mask, to thereby forming a patterned organic-containing silicon dioxide film 203A having contact holes 209 as shown in FIG. 8(c). In this case, since the second resist pattern 208 has misaligned with the first resist pattern 206, the diameter of the contact holes 209 is smaller than desired.

Figure 9A:
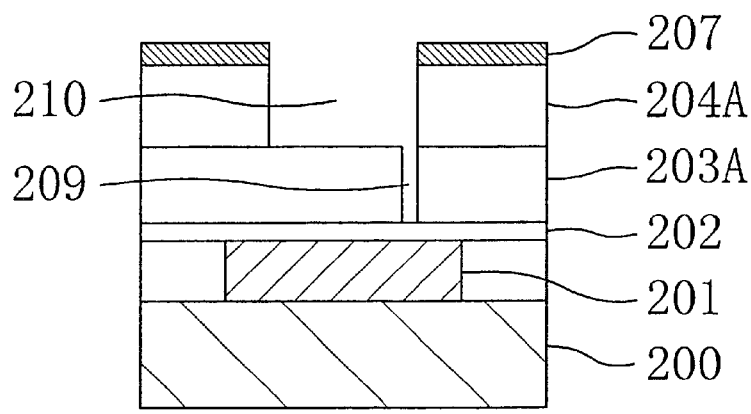
FIGS. 9(a) through 9(c) are cross-sectional views illustrating the problems caused by the misalignment of the second resist pattern during the process of forming the interconnection structure of the second embodiment.
Figure 9B:
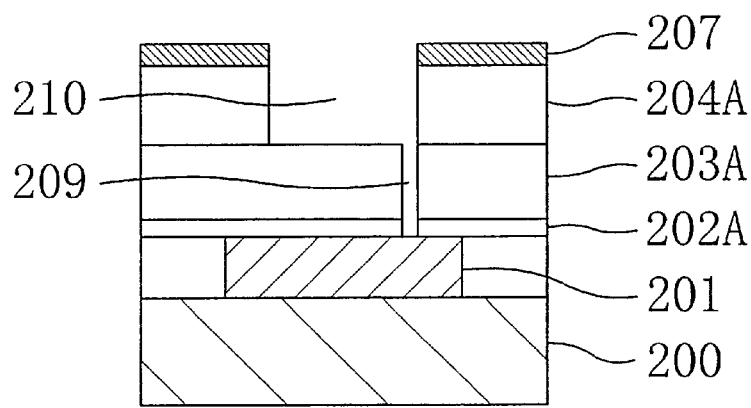
Figure 9C:
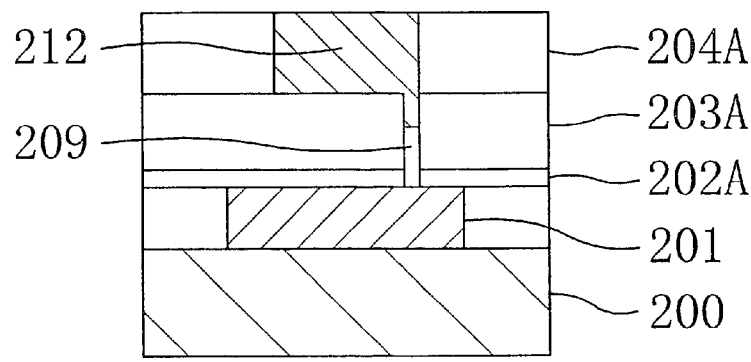

Next, the patterned organic film 204A is dry-etched using the mask pattern 207 as a mask, thereby forming wiring grooves 210 in the patterned organic film 204A as shown in FIG. 9(a). Then, the silicon nitride film 202 is dry-etched using the patterned organic-containing silicon dioxide film 203A as a mask, thereby forming a patterned silicon nitride film 202A and exposing the first metal interconnects 201 within the contact holes 209 as shown in FIG. 9(b).

Then, a metal film is deposited over the entire surface of the substrate to completely fill in the contact holes 209 and the wiring grooves 210. Thereafter, respective portions of the metal film and the mask pattern 207, which are deposited on the patterned organic film 204A, are removed by a CMP technique, for example. As a result, second metal interconnects 212 are certainly formed out of the metal film 211. However, since the diameter of the contact holes 209 is smaller than desired, the contact holes 209 cannot be completely filled in with the metal film and the first and second metal interconnects 201 and 212 cannot be interconnected to each other, resulting in a contact failure.

Next, it will be described with reference to FIGS. 10(a) through 10(c) and FIGS. 11(a) through 11(c) what measures should be taken to solve the problems caused by the misalignment of the second resist pattern 208.

First, a second resist pattern 208, having openings for forming contact holes, are formed through the same process steps as those described with reference to FIGS. 7(a) through 7(c) and FIG. 8(a). In this case, the second resist pattern 208 has also misaligned with the first resist pattern 206 (see FIG. 8(a)).

Figure 10A:
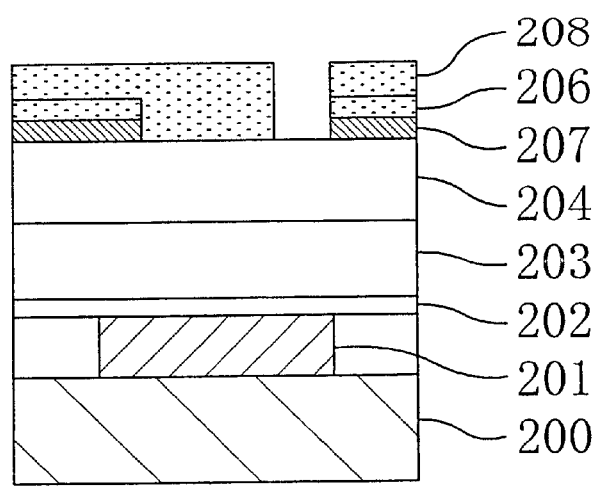
FIGS. 10(a) through 10(c) are cross-sectional views illustrating measures to solve the problems caused by the misalignment of the second resist pattern during the process of forming the interconnection structure of the second embodiment.

Thus, as shown in FIG. 10(a), the first resist pattern 206 and the mask pattern 207 are dry-etched using the second resist pattern 208 as a mask. In this manner, portions of the first resist pattern 206, not overlapping with the second resist pattern 208, are removed and each opening of the mask pattern 207 is expanded to be equal to or larger than each opening for forming a wiring groove or each opening for forming a contact hole. As a result, the pattern for the openings for forming contact holes in the second resist pattern 208 can be transferred to the first resist pattern 206 and the mask pattern 207.

Figure 10B:
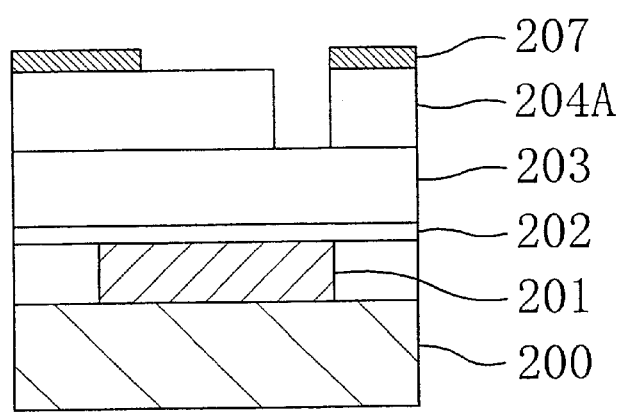

Then, the organic film 204 is dry-etched, thereby forming a patterned organic film 204A having the openings for forming contact holes as shown in FIG. 10(b). In this case, since the organic film 204 and the first and second resist patterns 206 and 208 are all mainly composed of organic components, the first and second resist patterns 206 and 208 are removed simultaneously with the dry-etching of the organic film 204.

Figure 10C:
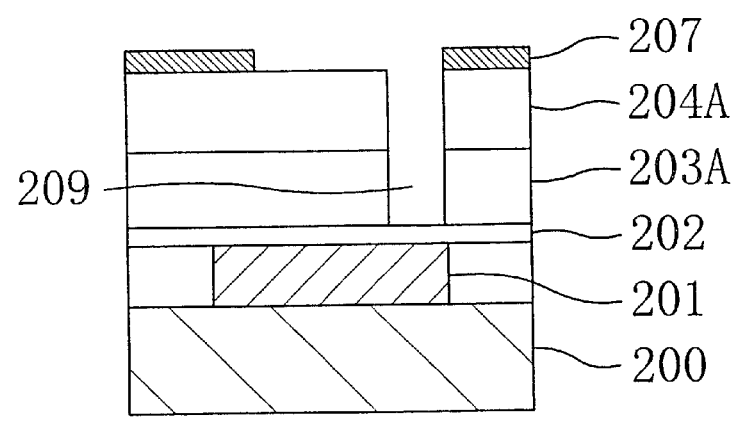

Then, the organic-containing silicon dioxide film 203 is dry-etched using the patterned organic film 204A as a mask, thereby forming a patterned organic-containing silicon dioxide film 203A having the contact holes 209 as shown in FIG. 10(c). In this case, the second resist pattern 208 has misaligned with the first resist pattern 206. However, the pattern for the openings for forming contact holes in the second resist pattern 208 has been successfully transferred to the first resist pattern 206 and the mask pattern 207. Thus, the diameter of the contact holes 209 is a predetermined size.

Figure 11A:
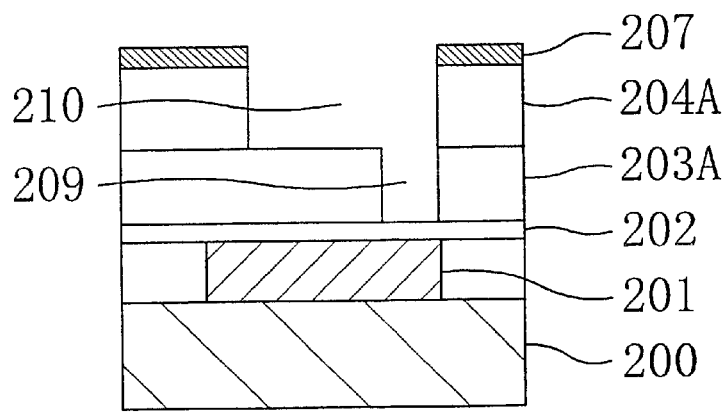
FIGS. 11(a) through 11(c) are cross-sectional views illustrating the measures to solve the problems caused by the misalignment of the second resist pattern during the process of forming the interconnection structure of the second embodiment.
Figure 11B:
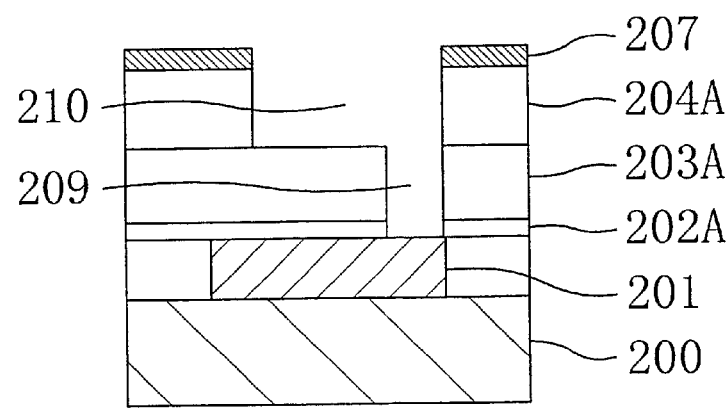

Next, the patterned organic film 204A is dry-etched using the mask pattern 207 as a mask, thereby forming wiring grooves 210 in the patterned organic film 204A as shown in FIG. 11(a). Then, the silicon nitride film 202 is dry-etched using the patterned organic-containing silicon dioxide film 203A as a mask, thereby forming a patterned silicon nitride film 202A and exposing the first metal interconnects 201 within the contact holes 209 as shown in FIG. 11(b).

Figure 11C:
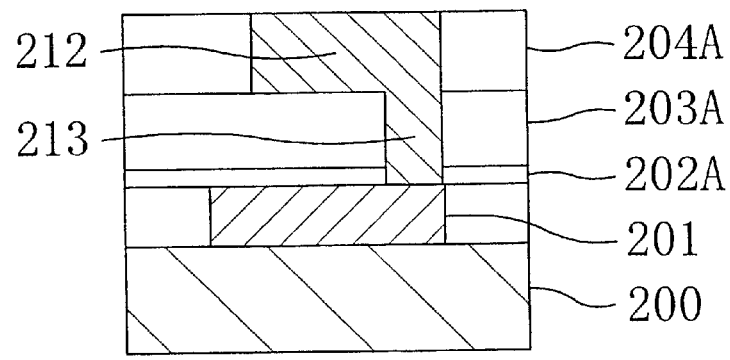

Then, a metal film is deposited over the entire surface of the substrate to completely fill in the contact holes 209 and the wiring grooves 210. And respective portions of the metal film and the mask pattern 207, which are deposited on the patterned organic film 204A, are removed by a CMP technique, for example. As a result, second metal interconnects 212 and contacts 213, interconnecting the first and second metal interconnects 201 and 212, are formed out of the metal film, as shown in FIG. 11(c).

Embodiment 3

Next, interconnection structure and method for forming the same according to the third embodiment of the present invention will be described with reference to FIGS. 12(a) through 12(c) and FIGS. 13(a) through 13(c).

First, a metal film is deposited on a semiconductor substrate 300 and then selectively dry-etched and patterned, thereby forming first metal interconnects 301. Then, a first organic-containing silicon dioxide film 302 (ire., an exemplary first insulating film), containing an organic component in silicon dioxide, is deposited to be 20 nm thick, for example, and to cover the first metal interconnects 301 such that grooves are left between the first metal interconnects 301. The first organic-containing silicon dioxide film 302 may be deposited by any arbitrary technique. For example, the film 302 may be deposited by a CVD process using a reactive gas mainly composed of phenyltrimethoxy silane.

Next, a low-dielectric-constant insulating film 303 (i.e., an exemplary second insulating film) is deposited to be 600 nm thick, for example, over the first organic-containing silicon dioxide film 302 and to fill in the grooves in the first organic-containing silicon dioxide film 302. The low-dielectric-constant insulating film 303 may be an SOG film, such as an HSQ film, mainly composed of silicon dioxide or an organic film mainly composed of an organic component.

The first organic-containing silicon dioxide film 302 can adhere strongly to metal interconnects, SOG film or organic film. This is because the organic-containing silicon dioxide film 302 has both organic groups and silicon-oxygen bonds (siloxane skeleton). That is to say, the silicon-oxygen bonds increase the adhesion to an SOG film or metal interconnects, and the organic groups increase the adhesion to an organic film.

Figure 12A:
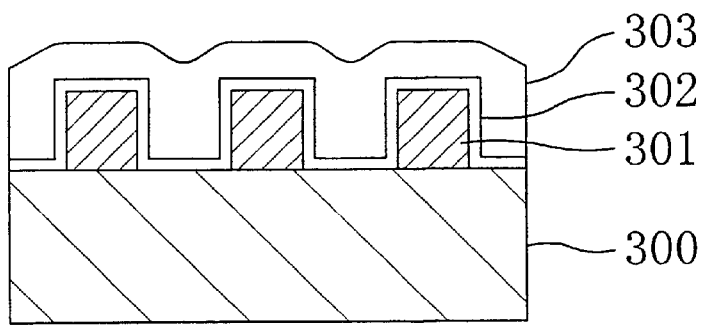
FIGS. 12(a) through 12(c) are cross-sectional views illustrating respective process steps for forming an interconnection structure according to the third embodiment of the present invention.
Figure 12B:
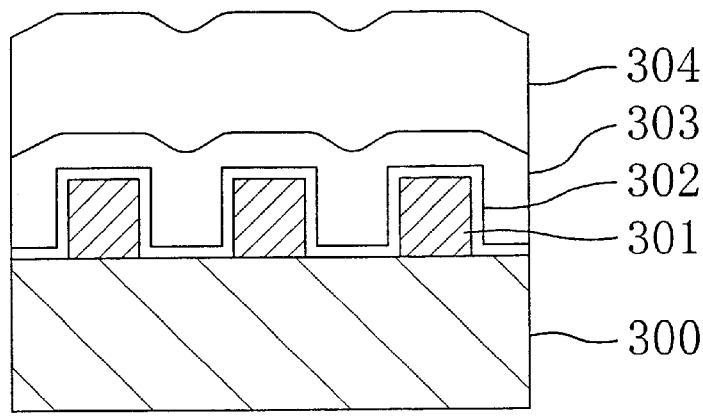

Subsequently, as shown in FIG. 12(b), a second organic-containing silicon dioxide film 304 (i.e., an exemplary third insulating film) is deposited to be 800 nm thick, for example, over the low-dielectric-constant insulating film 303. The second organic-containing silicon dioxide film 304 may be deposited by any arbitrary technique. For example, the film 304 may be deposited by a CVD process using a reactive gas mainly composed of phenyltrimethoxy silane. Alternatively, an ordinary silicon dioxide film or a fluorine-doped oxide film, not the second organic-containing silicon dioxide film 304, may be deposited as the third insulating film over the low-dielectric-constant insulating film 303.

Figure 12C:
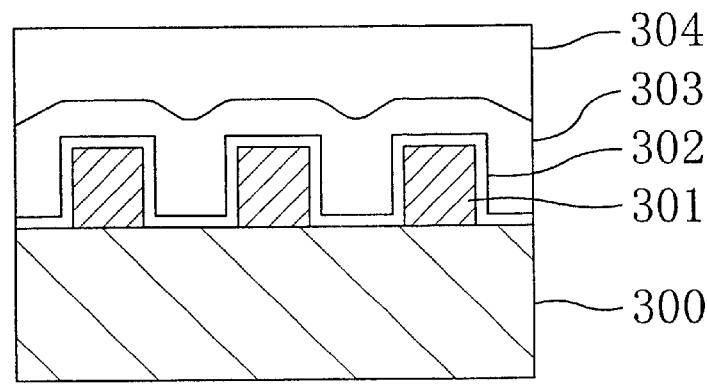
Figure 13A:
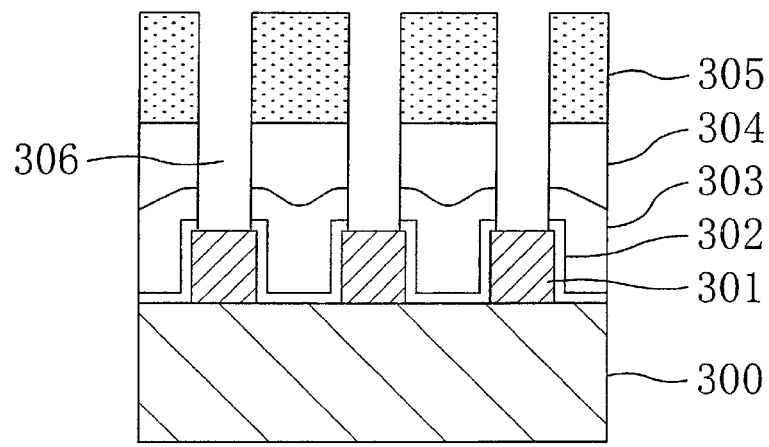
FIGS. 13(a) through 13(c) are cross-sectional views illustrating respective process steps for forming the interconnection structure of the third embodiment.

Thereafter, as shown in FIG. 12(c), the second organic-containing silicon dioxide film 304 is planarized by a CMP technique, for example. Then, as shown in FIG. 13(a), a resist pattern 305, having openings for forming contact holes, is formed by lithography on the second organic-containing silicon dioxide film 304. Subsequently, the second organic-containing silicon dioxide film 304, the low-dielectric-constant insulating film 303 and the first organic-containing silicon dioxide film 302 are dry-etched using the resist pattern 305 as a mask, thereby forming contact holes 306 and exposing the first metal interconnects 301.

Figure 13B:
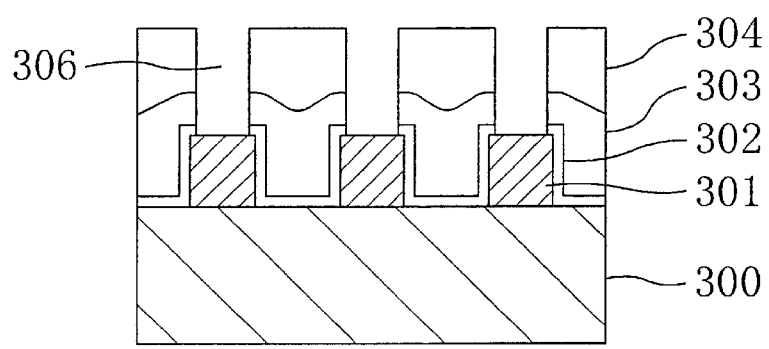
Figure 13C:
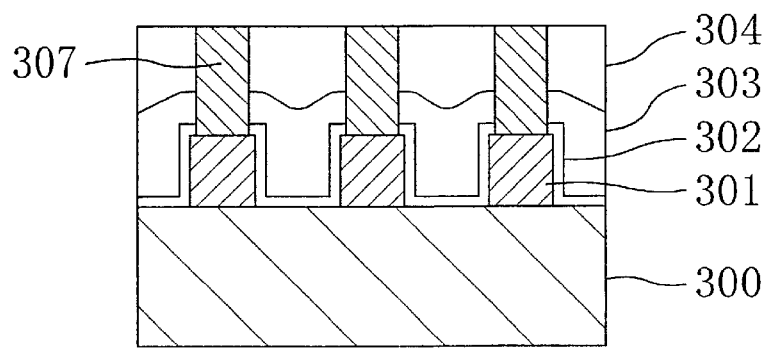

Next, as shown in FIG. 13(b), the resist pattern 305 is removed with post-glow oxygen plasma or water plasma or by anisotropic oxygen plasma reactive etching. Then, a metal film is deposited over the second organic-containing silicon dioxide film 304 to fill in the contact holes 306. And respective portions of the metal film, which are exposed on the second organic-containing silicon dioxide film 304, are removed by a CMP technique, for example, thereby forming contacts 307 out of the metal film as shown in FIG. 13(c). In this embodiment, the metal film may be made of any arbitrary metal. For example, copper, aluminum, gold, silver, nickel, cobalt, tungsten, or an alloy thereof may be used. Also, the metal film may be deposited by any arbitrary technique. For instance, plating, CVD or sputtering may be employed.

Although not shown, if second metal interconnects are formed on the second organic-containing silicon dioxide film 304 through the same process step for the first metal interconnects 301, then a multilevel interconnection structure can be formed.

In the third embodiment, the second organic-containing silicon dioxide film 304 has been deposited on the low-dielectric-constant insulating film 303 and then planarized. Alternatively, after the low-dielectric-constant insulating film 303 has been planarized, the second organic-containing silicon dioxide film 304 may be deposited on the low-dielectric-constant insulating film 303. In such a case, the upper surface of the planarized low-dielectric-constant insulating film 303 is preferably aligned with the upper surface of the first metal interconnects 301 or the first organic-containing silicon dioxide film 302.

Also, in the third embodiment, after the first organic-containing silicon dioxide film 302 has been deposited to cover the first metal interconnects 301, the low-dielectric-constant insulating film 303 is deposited to fill in the grooves in the first organic-containing silicon dioxide film 302. That is to say, the first organic-containing silicon dioxide film 302, adhering strongly to metal interconnects, SOG film or organic film and having a low relative dielectric constant (e.g., 3.2 or less), is interposed between the first metal interconnects 301 and the low-dielectric-constant insulating film 303 such as SOG film like an HSQ film or organic film not adhering strongly to metal interconnects. Accordingly, it is not necessary to interpose a high-dielectric-constant adhesion layer between the low-dielectric-constant insulating film 303 and the first metal interconnects 301.

Moreover, since the resist pattern 305 is formed on the second organic-containing silicon dioxide film 304, the second organic-containing silicon dioxide film 304 is not damaged during ashing and removing the resist pattern 305. This is because the ash rate of the resist pattern 305 is different from the etch rate of the second organic-containing silicon dioxide film 304.

As described above, in the third embodiment, the first organic-containing silicon dioxide film 302, adhering more strongly to the first metal interconnects 301 and showing a lower relative dielectric constant, is used as the first insulating film in direct contact with the first metal interconnects. The low-dielectric-constant insulating film 303 is used as the second insulating film interposed between the first metal interconnects 301. And the second organic-containing silicon dioxide film 304, adhering more strongly to second metal interconnects (not shown) and showing a lower relative dielectric constant, is used as the third insulating film in direct contact with the second metal interconnects. As a result, a highly reliable interconnection structure can be formed while reducing effective capacitance between interconnections, suppressing increase in contact resistance and preventing peeling of the interlevel insulating film from the metal interconnects.

What is claimed is:

1. An interconnection structure comprising:

a lower-level metal interconnect;

a first insulating film formed over the lower-level metal interconnect and mainly composed of organic-containing silicon oxide, in which silicon oxide contains an organic component, the first insulating film having a first contact opening provided above the lower-level metal interconnect;

a second insulating film formed over the first insulating film and mainly composed of an organic component, the second insulating film having a second contact opening provided above the first opening;

an upper-level metal interconnect formed in the second contact opening of the second insulating film; and a contact formed in the first contact opening of the first insulating film to electrically interconnect the lower-level and upper-level metal interconnect.

2. The interconnection structure of claim 1, wherein a phenyl group, bonded to a silicon atom, is introduced into silicon oxide in the organic-containing silicon oxide.

3. The interconnection structure of claim 1, further comprising a third insulating film provided between the lower-level metal interconnect and the first insulating film.

4. The interconnection structure of claim 3, wherein the third insulating film is composed of silicon nitride.

5. The interconnection structure of claim 1, wherein the second insulating film is made of a hydrogen carbide film.

6. The interconnection structure of claim 5, wherein the hydrogen carbide film contains fluorine.

7. The interconnection structure of claim 1, wherein the upper-level metal interconnect are composed of copper.

8. The interconnection structure of claim 2, wherein the contacts are composed of copper.

9. The interconnection structure of claim 1, wherein the second contact opening is in alignment with and directly above the first contact opening.

* * * * *

UNITED STATES PATENT AND TRADEMARK OFFICE
CERTIFICATE OF CORRECTION

PATENT NO. : 6,710,451 B2
DATED : March 23, 2004
INVENTOR(S) : Nobuo Aoi

It is certified that error appears in the above-identified patent and that said Letters Patent is hereby corrected as shown below:

<u>Title page,</u>
Item [75], Inventor, delete "Nishinomiya" and add -- Hyogo --

<u>Column 16,</u>
Line 28, delete "2" and add -- 1 --.

Signed and Sealed this

Thirty-first Day of August, 2004

JON W. DUDAS
*Director of the United States Patent and Trademark Office*